United States Patent
Ryu

(10) Patent No.: US 7,268,488 B2
(45) Date of Patent: Sep. 11, 2007

(54) DISPLAY DEVICE AND MOBILE DISPLAY HAVING A SEMI-TRANSPARENT METAL LAYER

(75) Inventor: Seoung-Yoon Ryu, Seoul (KR)

(73) Assignee: Samsung SDI Co., Ltd., Suwon (KR)

(*) Notice: Subject to any disclaimer, the term of this patent is extended or adjusted under 35 U.S.C. 154(b) by 405 days.

(21) Appl. No.: 10/927,186

(22) Filed: Aug. 27, 2004

(65) Prior Publication Data

US 2005/0082967 A1    Apr. 21, 2005

(30) Foreign Application Priority Data

Sep. 8, 2003    (KR) .................... 10-2003-0062850

(51) Int. Cl.
*H05B 33/14*     (2006.01)
*H01J 1/62*     (2006.01)

(52) U.S. Cl. .............. 313/506; 313/504; 428/690; 428/917

(58) Field of Classification Search ............... None
See application file for complete search history.

(56) References Cited

U.S. PATENT DOCUMENTS 6,528,188 B1*   3/2003   Suzuki et al. ............... 428/690
6,806,641 B2*   10/2004   Ueda et al. .................. 313/506
2001/0000005 A1*   3/2001   Forrest et al. ......... 204/192.12
2004/0081855 A1*   4/2004   Kim et al. .................. 428/690
2004/0245918 A1*   12/2004   Lee ............................. 313/503

FOREIGN PATENT DOCUMENTS

JP     10-144475     5/1998
JP     10144475 A *     5/1998

OTHER PUBLICATIONS

"2.2" QCIF Full Color Transparent AMOLED Display Lee et al., SID 2003 International Symposium Digest of Technical Papers vol. XXXIV, Book 1 pp. 104-107, May 20, 2003.*

* cited by examiner

*Primary Examiner*—Sikha Roy
(74) *Attorney, Agent, or Firm*—H.C. Park & Associates, PLC

(57) ABSTRACT

A display device, and a mobile display using the same, that may regulate a ratio of luminance in a lower direction to luminance in an upper direction. The display device has a transparent lower electrode formed on an insulation substrate, an organic emitting layer formed on the lower electrode, and an upper electrode formed on the organic emitting layer, where the upper electrode is comprised of a semi-transparent metal layer and a transparent conductive layer. The ratio of the luminance in the lower direction to the luminance in the upper direction is different according to a thickness of the semi-transparent metal layer.

14 Claims, 2 Drawing Sheets

DISPLAY DEVICE AND MOBILE DISPLAY HAVING A SEMI-TRANSPARENT METAL LAYER

This application claims the benefit of Korean Patent Application No. 2003-62850, filed on Sep. 8, 2003, which is hereby incorporated by reference for all purposes as if fully set forth herein.

BACKGROUND OF THE INVENTION

1. Field of the Invention

The present invention relates to a display device and a mobile display using the same and, more particularly, to a display device and a mobile display using the same that can regulate a ratio of luminance in a lower direction to luminance in an upper direction.

2. Discussion of the Related Art

Currently, a mobile display such as a dual folder mobile phone utilizes a flat panel display in which an exterior window and an interior window are mounted independently. In this case, however, each flat panel display is driven separately. Having two displays increases the product's thickness, power consumption and production costs.

In order to solve the problems stated above, a transparent organic light emitting device (OLED) can be utilized for the mobile display.

A cathode electrode of the transparent OLED may be made of a semi-transparent metal layer and a transparent conductive layer on the semi-transparent metal layer. However, a portion of light emitting from an OLED's organic emitting layer may be reflected by the semi-transparent metal layer and directed toward a rear direction, so that luminance in a rear direction is not coincident with luminance in a front direction. As a result, it is difficult to regulate a ratio of the luminance in the rear direction to the luminance in the front direction.

SUMMARY OF THE INVENTION

Accordingly, the present invention is directed to a display device and mobile display using the same that substantially obviates one or more of the problems due to limitations and disadvantages of the related art.

This invention provides a transparent OLED display that regulates a ratio of luminance in a lower direction to luminance in an upper direction thereof.

This invention also provides a mobile display using the transparent OLED display.

Additional features of the invention will be set forth in the description which follows, and in part will be apparent from the description, or may be learned by practice of the invention.

The present invention discloses a transparent OLED display comprising a transparent lower electrode formed on an insulation substrate, an organic emitting layer formed on the lower electrode, and an upper electrode formed on the organic emitting layer. It further discloses that the upper electrode has a semi-transparent metal layer and a transparent conductive layer, wherein a ratio of luminance in a direction of the lower electrode to luminance in a direction of the upper electrode is different according to a thickness of the semi-transparent metal layer.

The present invention also discloses a transparent OLED display comprising a lower electrode formed on an insulation substrate, an organic layer having an emitting layer formed on the lower electrode, and an upper electrode formed on the organic layer. It further discloses that the upper electrode has a semi-transparent metal layer and a transparent conductive layer, wherein a ratio of luminance in a direction of the lower electrode to luminance in a direction of the upper electrode is not less than 4.5.

The present invention also discloses a transparent OLED display comprising a transparent lower electrode formed on an insulation substrate, an organic layer having an emitting layer formed on the lower electrode, and an upper electrode formed on the organic layer. It further discloses an upper electrode that has a semi-transparent metal layer and a transparent conductive layer, wherein a ratio of luminance in a direction of the lower electrode to luminance in a direction of the upper electrode is not more than 3.5.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
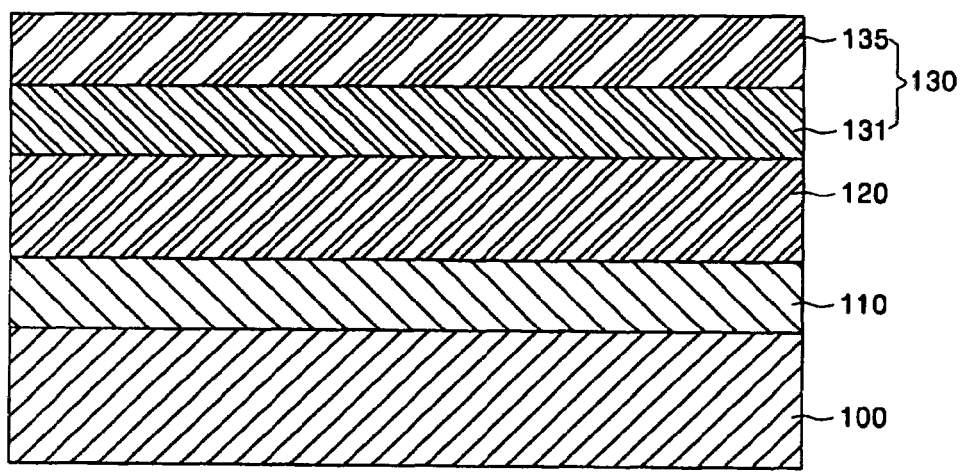
FIG. 1 shows a cross-sectional view of a transparent OLED according to an exemplary embodiment of the present invention.

Reference will now be made in detail to an embodiment of the present invention, example of which is illustrated in the accompanying drawings. In the drawings, the thickness of layers and regions are exaggerated for clarity. Like numbers refer to like elements throughout the specification.

FIG. 1 shows a cross-sectional view of a transparent OLED according to an exemplary embodiment of the present invention.

Referring to FIG. 1, a transparent lower electrode 110 is formed as an anode by depositing and patterning transparent conductive material such as indium tin oxide (ITO), indium zinc oxide (IZO), or other like material on an insulation substrate 100.

Next, an organic emitting layer 120 may be formed on the transparent lower electrode 110 by forming a hole injecting layer (HIL), a hole transporting layer (HTL), an emitting layer (EML), a hole blocking layer (HBL), an electron transporting layer (ETL), and an electron injecting layer (EIL), successively.

After forming the organic emitting layer 120, a semi-transparent metal layer 131 may be formed by thinly depositing Mg:Ag on it. ITO or IZO may then be deposited on the semi-transparent metal layer 131 to form a transparent conductive layer 135, thereby forming an upper electrode 130 acting as cathode electrode. Formation of the upper electrode 130, which has a double layer structure consisting of the semi-transparent metal layer 131 and the transparent conductive layer 135, completes the construction of the transparent OLED according to an exemplary embodiment of the present invention.

Embodiment 1

In case of HIL 600 angstroms (Å), HTL 300 Å, EML 225 Å, HBL 50 Å, ETL 250 Å, LiF 30 Å as an EIL, Mg:Ag 95 Å as a semi-transparent metal layer, and IZO 800 Å as a transparent conductive layer, a ratio of luminance in a direction towards the lower electrode to luminance in a direction towards the upper electrode is about 4.5.

Embodiment 2

In case of HIL 400 Å, HTL 300 Å, EML 300 Å, HBL 50 Å, ETL 150 Å, LiF 30 Å as an EIL, Mg:Ag 130 Å as a semi-transparent metal layer, and IZO 800 Å as a transparent conductive layer, a ratio of luminance in a direction towards the lower electrode to luminance in a direction towards the upper electrode is about 7.8.

Embodiment 3

In case of HIL 400 Å, HTL 300 Å, EML 300 Å, HBL 50 Å, ETL 350 Å, LiF 30 Å as an EIL, Mg:Ag 60 Å as a semi-transparent metal layer, and IZO 800 Å as a transparent conductive layer, a ratio of luminance in a direction towards the lower electrode to luminance in a direction towards the upper electrode is about 3.2.

Embodiment 4

In case of HIL 800 Å, HTL 300 Å, EML 300 Å, HBL 50 Å, ETL 350 Å, LiF 30 Å as an EIL, Mg:Ag 130 Å as a semi-transparent metal layer, and IZO 800 Å as a transparent conductive layer, a ratio of luminance in a direction towards the lower electrode to luminance in a direction towards the upper electrode is about 8.7.

Embodiment 5

In case of HIL 800 Å, HTL 300 Å, EML 300 Å, HBL 50 Å, ETL 150 Å, LiF 30 Å as an EIL, Mg:Ag 60 Å as a semi-transparent metal layer, and IZO 800 Å as a transparent conductive layer, a ratio of luminance in a direction towards the lower electrode to luminance in a direction towards the upper electrode is about 3.4.

hole blocking layer (HBL), the electron transporting layer (ETL), the LiF used as the electron injecting layer (EIL), and the conductive layer of the upper electrode are transparent, they may have minimal effect on luminance. Accordingly, it can easily be shown that the ratio of the luminance in the direction towards the lower electrode to the luminance in the direction towards the upper electrode depends on the thickness of the semi-transparent metal layer Mg:Ag.

Figure 3:
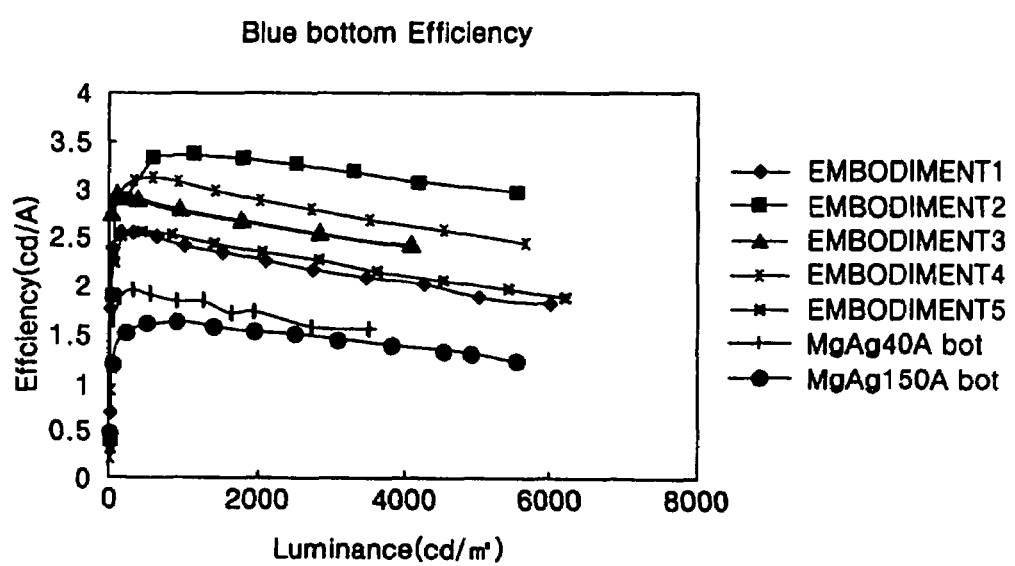
FIG. 3 shows luminance in a direction of a lower electrode of an organic light emitting device according to exemplary embodiments 1, 2, 3, 4 and 5 of the present invention.

Referring to the embodiment 1, where the semi-transparent metal layer Mg:Ag is 95 Å thick, the ratio of the luminance in the direction towards the lower electrode to the luminance in the direction towards the upper electrode is about 4.5. Further, referring to embodiments 2 and 4, where the semi-transparent metal layer Mg:Ag is 130 Å thick, the ratio of the luminance in the direction towards the lower electrode to the luminance in the direction towards the upper electrode is in the range of about 7.8 to 8.7. As FIG. 3 shows, when the thickness of the Mg:Ag layer is not less than 150 Å, luminance in the direction towards the lower electrode is lowered, thereby degrading the transparent OLED's performance. In other words, when the Mg:Ag layer is 95 to 130 Å thick, the ratio of the luminance in the direction towards the lower electrode to the luminance in the direction towards the upper electrode can be adjusted to a range of about 4.5 to 8.7.

Furthermore, referring to embodiments 3 and 5, when the semi-transparent metal layer Mg:Ag is not more than 60 Å thick, the ratio of the luminance in the direction towards the lower electrode to the luminance in the direction towards the upper electrode is not more than about 3.5. Also, when the Mg:Ag layer has a thickness of 40 Å, the ratio of the luminance in the direction towards the lower electrode to the luminance in the direction towards the upper electrode is about 3.2. And when the Mg:Ag layer is not more than 40 Å thick, luminance in the direction towards the lower electrode may be lowered to degrade the transparent OLED's performance. In other words, when the Mg:Ag layer is 40 to 60 Å thick, the ratio of the luminance in the direction towards the lower electrode to the luminance in the direction towards the upper electrode can be adjusted in the range of about 3.2 to 3.4.

In conclusion, by adjusting the thickness of the semi-transparent metal layer Mg:Ag, luminance in the direction towards the upper electrode and in the direction towards the lower electrode can be regulated.

Additionally, when a transparent OLED that can regulate luminance in the direction towards the upper electrode and in the direction towards the lower electrode is utilized for a

|  | HIL | HTL | EML | HBL | ETL | LiF | Mg:Ag | IZO | Ratio |
|---|---|---|---|---|---|---|---|---|---|
| Embodiment 1 | 600 | 300 | 225 | 50 | 250 | 30 | 95 | 800 | 4.5 |
| Embodiment 2 | 400 | 300 | 300 | 50 | 150 | 30 | 130 | 800 | 7.8 |
| Embodiment 3 | 400 | 300 | 300 | 50 | 350 | 30 | 60 | 800 | 3.2 |
| Embodiment 4 | 800 | 300 | 300 | 50 | 350 | 30 | 130 | 800 | 8.7 |
| Embodiment 5 | 800 | 300 | 300 | 50 | 150 | 30 | 60 | 800 | 3.4 |

Figure 2:
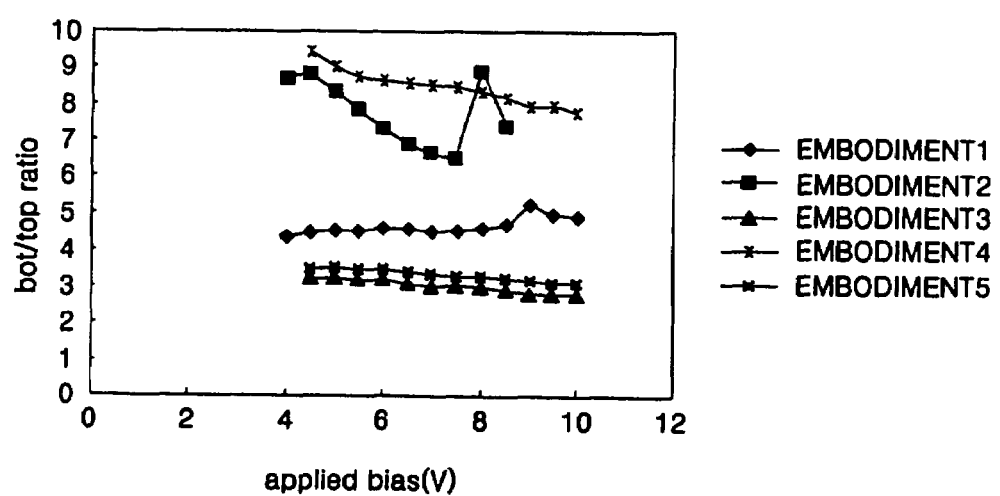
FIG. 2 shows a a ratio of luminance in a direction of a lower electrode to luminance in a direction of an upper electrode according to exemplary embodiments 1, 2, 3, 4 and 5 of the present invention.

FIG. 2 and Table 1 show a ratio of luminance in a direction towards the lower electrode to luminance in a direction towards the upper electrode according to exemplary embodiments 1, 2, 3, 4, and 5. FIG. 3 is a view showing luminance in the direction towards the lower electrode of the OLED according to exemplary embodiments 1, 2, 3, 4 and 5.

Referring to Table 1, FIG. 2 and FIG. 3, since the hole injecting layer (HIL), the hole transporting layer (HTL), the mobile display, particularly a dual folder mobile phone, it may reduce the product thickness, power consumption and production cost.

As described thus far, the exemplary embodiments of the present invention disclose a transparent OLED that can regulate a ratio of luminance in a direction towards the lower electrode to luminance in a direction towards the upper electrode by adjusting a thickness of the semi-transparent metal layer.

Also, according to exemplary embodiments of the present invention, there is disclosed a mobile display that utilizes the OLED that can regulate the ratio of the luminance in the direction towards the lower electrode to the luminance in the direction towards the upper electrode.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting device (OLED), comprising:
    a transparent lower electrode formed on an insulation substrate;
    an organic emitting layer formed on the lower electrode; and
    an upper electrode formed on the organic emitting layer and having a semi-transparent metal layer and a transparent conductive layer,
    wherein a ratio of luminance in a direction towards the lower electrode to luminance in a direction towards the upper electrode is different according to a thickness of the semi-transparent metal layer,
    wherein either the semi-transparent metal layer is not less than 95 Å in thickness and the ratio of the luminance in the direction towards the lower electrode to the luminance in the direction towards the upper electrode is not less than 4.5 or the semi-transparent metal layer is not more than 60 Å in thickness and the ratio of the luminance in the direction towards the lower electrode to the luminance in the direction towards the upper electrode is not more than 3.5.

2. The OLED of claim 1, wherein the semi-transparent metal layer is made of Mg:Ag.

3. The OLED of claim 1, wherein the semi-transparent metal layer has a thickness of 95 to 130 Å, and the ratio of the luminance in the direction towards the lower electrode to the luminance in the direction towards the upper electrode is in the range of 4.5 to 8.7.

4. The transparent OLED of claim 1, wherein the semi-transparent metal layer has a thickness of 40 to 60 Å, and the ratio of the luminance in the direction towards the lower electrode to the luminance in the direction towards the upper electrode is in the range of 3 to 3.5.

5. The OLED of claim 1,
    wherein the thickness of the semi-transparent metal layer is not less than 95° A and the ratio of the luminance in the direction towards the lower electrode to the luminance in the direction towards the upper electrode is not less than 4.5.

6. The OLED of claim 5, wherein the ratio of the luminance in the direction towards the lower electrode to the luminance in the direction towards the upper electrode is in the range of 4.5 to 8.7.

7. The OLED of claim 5, wherein the semi-transparent metal layer is made of Mg:Ag at a thickness of 95 to 150 Å.

8. The OLED of claim 1,
    wherein the thickness of the semi-transparent metal layer is not more than 60° A and the ratio of the luminance in the direction towards the lower electrode to the luminance in the direction towards the upper electrode is not more than 3.5.

9. The OLED of claim 8, wherein the ratio of the luminance in the direction towards the lower electrode to the luminance in the direction towards the upper electrode is in the range of 3 to 3.5.

10. The OLED of claim 8, wherein the semi-transparent metal layer is made of Mg:Ag at a thickness of 40 to 60 Å.

11. A mobile display using an organic light emitting device, wherein the organic light emitting device comprises:
    a lower electrode formed on an insulation substrate;
    an organic layer having an emitting layer formed on the lower electrode; and
    an upper electrode formed on the organic emitting layer and having a semi-transparent metal layer and a transparent conductive layer,
    wherein a ratio of luminance in a direction towards the lower electrode to luminance in a direction towards the upper electrode is different according to a thickness of the semi-transparent metal layer,
    wherein either the semi-transparent metal layer is not less than 95 Å in thickness and the ratio of the luminance in the direction towards the lower electrode to the luminance in the direction towards the upper electrode is not less than 4.5 or the semi-transparent metal layer is not more than 60 Å in thickness and the ratio of the luminance in the direction towards the lower electrode to the luminance in the direction towards the upper electrode is not more than 3.5.

12. The mobile display of claim 11, wherein the mobile display using transparent organic light emitting device is a mobile phone.

13. An organic light emitting device (OLED), comprising:
    a transparent lower electrode formed on an insulation substrate;
    an organic emitting layer formed on the lower electrode; and
    an upper electrode formed on the organic emitting layer and having a semi-transparent metal layer and a transparent conductive layer,
    wherein a ratio of luminance in a direction towards the lower electrode to luminance in a direction towards the upper electrode is different according to a thickness of the semi-transparent metal layer,
    wherein the organic emission layer is comprised of a hole injecting layer, a hole transporting layer, an emitting layer, a hole blocking layer, an electron transporting layer, and an electron injecting layer,
    wherein either the semi-transparent metal layer is not less than 95 Å in thickness and the ratio of the luminance in the direction towards the lower electrode to the luminance in the direction towards the upper electrode is not less than 4.5 or the semi-transparent metal layer is not more than 60 Å in thickness and the ratio of the luminance in the direction towards the lower electrode to the luminance in the direction towards the upper electrode is not more than 3.5.

14. The OLED of claim 13, wherein the electron injecting layer is comprised of LiF.

* * * * *